(12) United States Patent
Lin

(10) Patent No.: US 11,457,307 B2
(45) Date of Patent: Sep. 27, 2022

(54) HEADPHONE DRIVER AND DRIVING METHOD THEREOF

(71) Applicant: MACRONIX International Co., Ltd., Hsinchu (TW)

(72) Inventor: Hsiao-Ming Lin, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 90 days.

(21) Appl. No.: 17/182,891

(22) Filed: Feb. 23, 2021

(65) Prior Publication Data
US 2022/0272444 A1  Aug. 25, 2022

(51) Int. Cl.
*H04R 3/00* (2006.01)
*H04R 5/033* (2006.01)
*H03F 3/45* (2006.01)

(52) U.S. Cl.
CPC .......... *H04R 3/00* (2013.01); *H03F 3/45269* (2013.01); *H04R 5/033* (2013.01); *H03F 2200/03* (2013.01)

(58) Field of Classification Search
CPC . H04R 3/00; H04R 5/033; H04R 1/10; H04R 25/00; H04S 1/007; H03F 3/45269; H03F 2200/03
See application file for complete search history.

(56) References Cited

U.S. PATENT DOCUMENTS

| 8,290,171 B1 * | 10/2012 | Helfrich | .................. | H04R 5/04 381/74 |
| 10,524,041 B1 | 12/2019 | Lin | | |
| 2007/0109049 A1 | 5/2007 | Wu | | |
| 2007/0223718 A1 | 9/2007 | Felder et al. | | |
| 2013/0257535 A1 | 10/2013 | Mengad | | |
| 2016/0100243 A1 * | 4/2016 | Wismar | .................. | H03F 3/187 381/74 |
| 2017/0078815 A1 * | 3/2017 | Miki | ........................ | H04R 3/00 |

FOREIGN PATENT DOCUMENTS

| CN | 109922394 | 9/2020 |
| CN | 111900940 | 11/2020 |
| TW | 202041046 | 11/2020 |

OTHER PUBLICATIONS

"Office Action of Taiwan Counterpart Application", dated May 5, 2022, p. 1-p. 4.

* cited by examiner

*Primary Examiner* — David L Ton
(74) *Attorney, Agent, or Firm* — J.C. Patents

(57) ABSTRACT

A headphone driver is used to drive a headphone apparatus, which includes a first differential driver, a first positive output terminal, a first negative output terminal, and a second negative output terminal. The first positive output terminal is connected to the first terminal. A switch unit is disposed on a feedback path at the first negative output terminal and the second negative output terminal, to enable the first/second negative output terminal in feedback as a close loop to output to the third/fourth terminal and disable the second/first negative output terminal at a first/second operation state. The first differential driver includes a first positive voltage driving circuit, a first negative voltage driving circuit, and a second negative voltage driving circuit, respectively providing the first positive output terminal, the first negative output terminal, and the second negative output terminal.

20 Claims, 14 Drawing Sheets

HEADPHONE DRIVER AND DRIVING METHOD THEREOF

BACKGROUND OF THE INVENTION

Field of the Invention

The disclosure relates to a headphone driving technology, and in particular to a headphone driver and a driving method, which is suitable for driving a four-terminal headphone apparatus with two standards.

Description of Related Art

Headphone apparatuses are commonly used with electronic products to provide actual sound to the user, and headphones that can produce stereo sound are even more common.

As is generally known, a stereo headphone may include two speakers corresponding to two channels. A speaker generally includes a first terminal and a second terminal. The first terminal receives electrical audio, and its waveform changes with the sound. The second terminal is the ground terminal, which corresponds to the electrical audio of the first terminal, and forms an AC signal between the first terminal and the second terminal according to the vibration frequency and amplitude, so as to promote the vibration of the speaker diaphragm. In this way, the two second terminals of the two speakers of the headphone will be connected together, and the two first terminals of the two speakers will receive two channels of audio respectively. Therefore, the receiving terminal of the two-channel headphone has a three-terminal structure.

The sound to be presented by the headphone is provided by the driver. As known in general use, the three-terminal plug of the headphone should be plugged into the output hole of the electronic product. The headphone driver provides electrical sound driving signals to the three terminals of the output hole to drive the speaker to convert the audio into actual sound.

Two speakers provide sound sources of different channels with two drivers. A driver converts the sound of the corresponding channel into an electrical signal, which is then output from the output terminal. The other driver also converts the sound of the corresponding channel into an electrical signal, which is then output from the output terminal.

The further design of the headphone apparatus is to integrate the microphone so as to transmit a user's voice, which substantially improves the function of the headphone apparatus, making it more widely used.

With the configuration of the headphone apparatus including the microphone, the signal plug-in terminal includes four terminals. However, for microphones with different configurations, the order of the ground terminal and the microphone terminal will be different.

Generally speaking, headphone apparatuses of different standards may be switched and connected by operating the switch according to the detection result. The impedance of the speaker of the headphone apparatus is generally 32 ohms or may be 16 ohms in another example. Thus, under the condition that the switch does not affect the operation of the headphone apparatus, the resistance effect of the switch needs to be small, which causes that the design of the switch requires a larger area to reduce impedance.

SUMMARY OF THE INVENTION

The disclosure provides a headphone driver and a driving method thereof, in which the switch may be manufactured using metal oxide semiconductor (MOS) transistors, and the switch of the MOS transistor can meet the requirements of small area and low impedance.

According to an embodiment, the disclosure provides a headphone driver, driving a headphone apparatus, where the headphone apparatus has a first terminal, a second terminal, a third terminal, and a fourth terminal of fixed positions. The headphone driver includes a first differential driver, a second differential driver, a first switch unit, and a second switch unit. A first differential driver includes a first positive drive circuit, a first negative drive circuit, and a second negative drive circuit, respectively providing a first positive output terminal, a first negative output terminal, and a second negative output terminal, where the first positive output terminal is connected to the first terminal, and the first negative output terminal and the second negative output terminal are respectively connected to the third terminal and the fourth terminal. A second differential driver includes a second positive drive circuit, a third negative drive circuit, and a fourth negative drive circuit, respectively providing a second positive output terminal, a third negative output terminal, and a fourth negative output terminal, where the second positive output terminal is connected to the second terminal, and the first negative output terminal and the second negative output terminal are respectively connected to the third terminal and the fourth terminal. A first switch unit controls the first differential driver to respectively select according to the first operation state or the second operation state the first negative drive circuit or the second negative drive circuit to output. A second switch unit controls the second differential driver to respectively select according to the first operation state or the second operation state the third negative drive circuit or the fourth negative drive circuit to output.

According to an embodiment, the disclosure further provides a headphone driver, driving a headphone apparatus, where the headphone apparatus has a first terminal, a second terminal, a third terminal, and a fourth terminal of fixed positions. The headphone driver includes a first differential driver and a first switch unit. A first differential driver includes a first positive output terminal, a first negative output terminal, and a second negative output terminal, where the first positive output terminal connected to the first terminal. A first switch unit is disposed on a feedback path of the first negative output terminal and the second negative output terminal, configured to enable the first negative output terminal in feedback as a close loop to output to the third terminal in a first operation state and disable the second negative output terminal in feedback and disable output of the second negative output terminal as an open loop, and to be switched to enable the second negative output terminal in feedback as a close loop to output to the fourth terminal in a second operation state and disable the first negative output terminal in feedback and disable output of the first negative output terminal as an open loop, the first differential driver including a first positive voltage driving circuit, a first negative voltage driving circuit, and a second negative voltage driving circuit, respectively providing the first positive output terminal, the first negative output terminal, and the second negative output terminal.

According to an embodiment, the disclosure further provides a headphone driving method, driving a headphone apparatus, where the headphone apparatus has a first terminal, a second terminal, a third terminal, and a fourth terminal of fixed positions. The headphone driving method includes driving a first channel of the headphone apparatus and a microphone using a first differential driver, the first differential driver includes a first positive output terminal, a first negative output terminal, and a second negative output terminal, the first positive output terminal connected to the first terminal. The headphone driving method further includes using a first switch unit, disposed on a feedback path of the first negative output terminal and the second negative output terminal, configured to be switched to connect the first negative output terminal to the third terminal in a first operation state, and disconnect the second negative output terminal, and to be switched to connect the second negative output terminal to the fourth terminal in a second operation state, and disconnect the first negative output terminal. The first differential driver includes a first negative voltage driving circuit and a second negative voltage driving circuit, respectively providing the first negative output terminal and the second negative output terminal.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
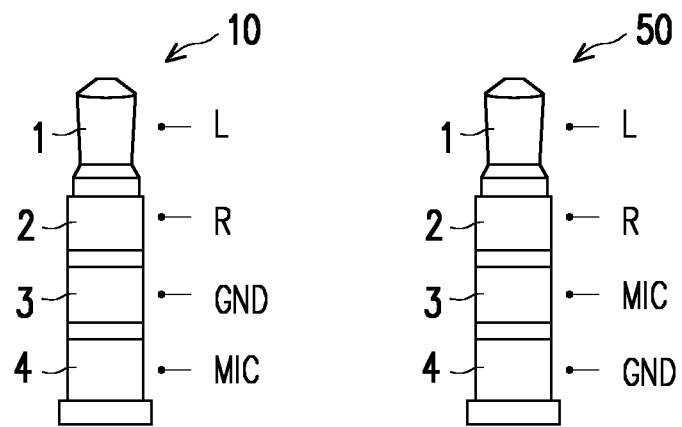
FIG. 1 is a schematic structural diagram of a plug of a four-terminal headphone apparatus according to two standards to be considered in the disclosure.

Reference will now be made in detail to the exemplary embodiments of the disclosure, examples of which are illustrated in the accompanying drawings. Wherever possible, the same reference numbers are used in the drawings and the description to refer to the same or like parts.

The conventional three-terminal headphone apparatus provides only a stereo audio source. A plug of the headphone apparatus includes a left channel terminal (L), a right channel terminal (R), and a ground terminal (GND). To enable wider application of the three-terminal headphone apparatus, a microphone may be further configured, thus allowing users to transmit audio sources. In other words, the three-terminal headphone apparatus is turned into a four-terminal headphone apparatus, and one of the terminals is used to connect to the microphone (MIC). With the demand for mobile electronic devices such as mobile phones, there is a broader demand for four-terminal headphone apparatus.

There are currently two standards for the four-terminal headphone apparatus, one is the OMTP standard, usually referred to as the international standard, and the other is the CTIA standard, referred to as the American standard. The difference between the OMTP standard and the CTIA standard is that the order of the microphone terminal (MIC) and ground terminal (GND) is reversed.

The disclosure delves into the difference between the OMTP standard and the CITA standard as well as the switching mechanism, and proposes that at least a size of a switch unit required for switching can be reduced, such as using a MOS transistor, so as to achieve low-impedance switch element while maintaining the element area requirements.

A number of embodiments are provided below to illustrate the disclosure, but the disclosure is not limited to the illustrated embodiments.

The disclosure first delves into the difference between the OMTP standard and the CTIA standard as well as the detection with switching mechanism. FIG. 1 is a schematic structural diagram of a plug of a four-terminal headphone apparatus according to two standards to be considered in the disclosure. Please refer to FIG. 1. The order of four terminals 1, 2, 3 and 4 of a plug 10 of a CTIA headphone apparatus is left channel terminal (L), right channel terminal (R), ground terminal (GND), and microphone terminal (MIC). The positions of the four terminals 1, 2, 3, 4 of the plug 10 and the positions of the four terminals 1, 2, 3, 4 of a plug 50 are fixed. The order of the four terminals 1, 2, 3, and 4 of the plug 50 of an OMTP headphone apparatus is left channel terminal (L), right channel terminal (R), microphone terminal (MIC), and ground terminal (GND). The difference between the two is that the lower two terminals GND and MIC are reversed.

Figure 2:
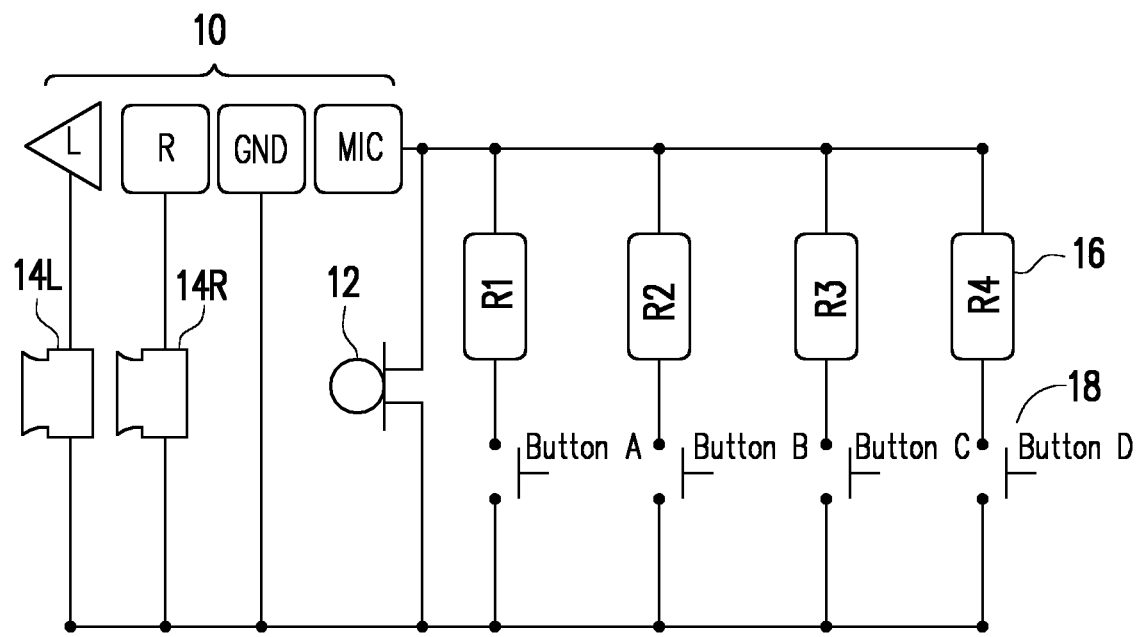
FIG. 2 is a schematic diagram of a structure of a CTIA headphone apparatus considered according to an embodiment of the disclosure.

FIG. 2 is a schematic diagram of a structure of a CTIA headphone apparatus considered according to an embodiment of the disclosure. Please refer to FIG. 2. Taking the CTIA headphone apparatus as an example, the plug 10, a speaker 14L, a speaker 14R, and a microphone 12 are configured to include the two-channel speakers 14L and 14R connected to the left channel terminal (L) and the right channel terminal (R). The ground terminal (GND) is behind the right channel terminal (R), followed by the microphone terminal (MIC). The microphone 12 is connected between the ground terminal (GND) and the microphone terminal (MIC). Also, multiple buttons 18, such as button A to button D, allow the microphone 12 to be connected in parallel with different resistors 16, such as resistance elements R1, R2, R3, and R4.

Since the plug 10 of the CTIA headphone apparatus is different from the plug 50 of the OMTP headphone apparatus, the electronic device is equipped with a headphone identification circuit 20, which is connected to the ground terminal (GND) and the microphone terminal (MIC), and may identify whether the headphone apparatus being used is a CTIA headphone apparatus or an OMTP headphone apparatus. The headphone identification circuit 20 includes a voltage measuring element 22 and a voltage source 24. The voltage source 24 is configured to apply voltage to the microphone 12, which is connected to the fourth terminal that corresponds to the microphone terminal (MIC) of the CTIA headphone apparatus. The headphone identification circuit 20 may determine the type of the headphone apparatus, to be provided to the headphone driver for switching.

Figure 3:
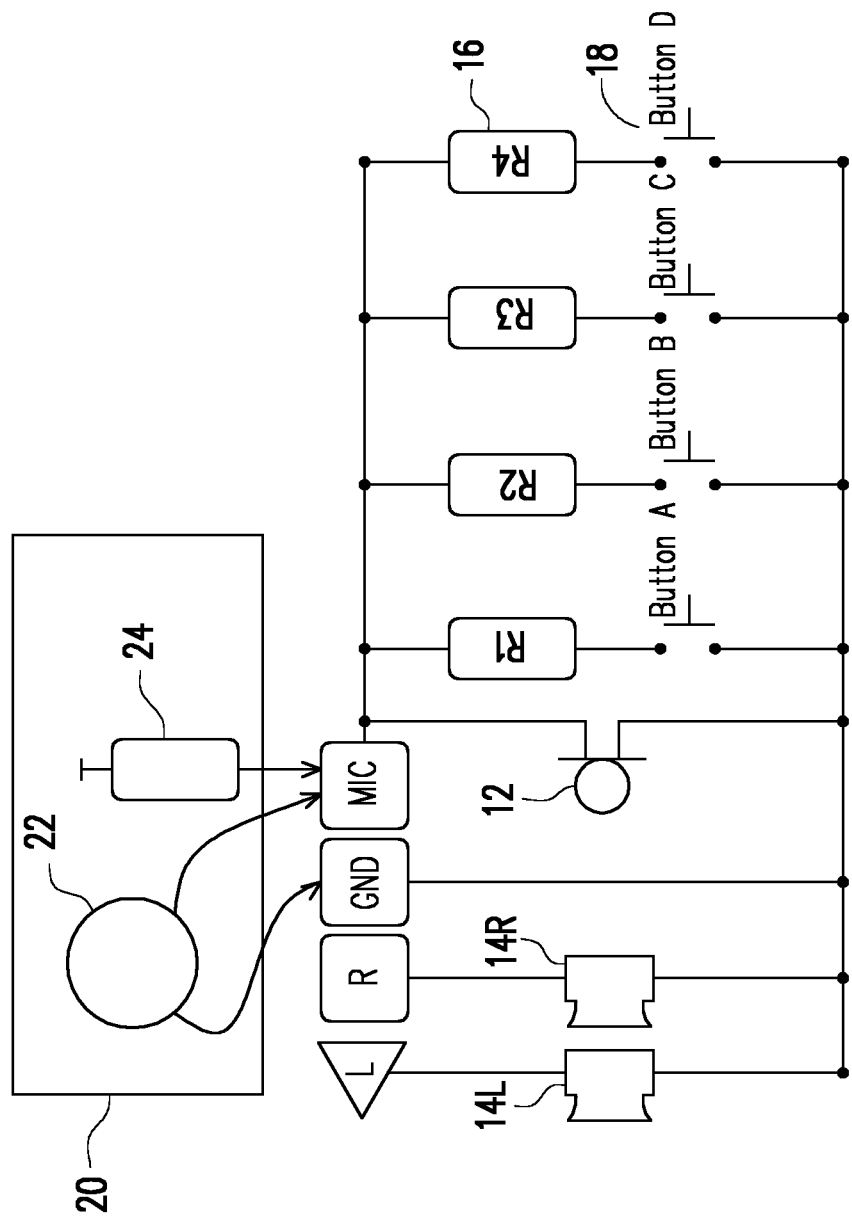
FIG. 3 is a schematic structural diagram of a headphone apparatus of FIG. 2 including a headphone identification circuit according to an embodiment of the disclosure.
Figure 4:
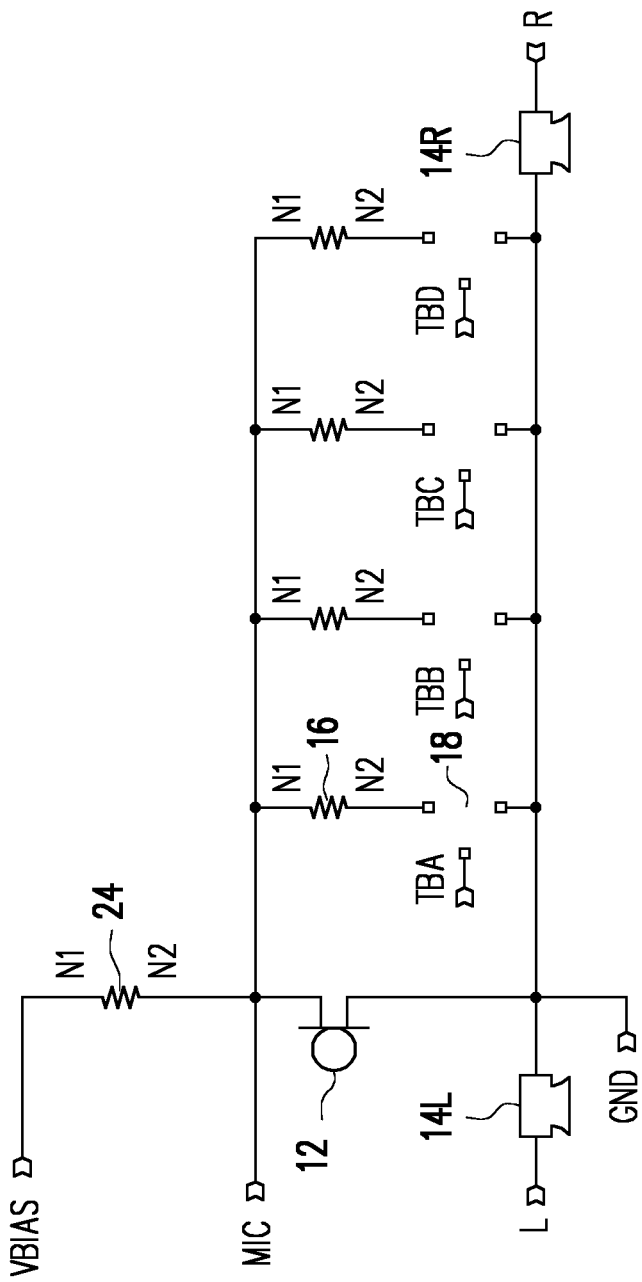
FIG. 4 is a schematic diagram of an equivalent circuit of a headphone apparatus of FIG. 3 according to an embodiment of the disclosure.

FIG. 4 is a schematic diagram of an equivalent circuit of a headphone apparatus of FIG. 3 according to an embodiment of the disclosure. Please refer to FIG. 4. Considering the circuit structure with reference to the four terminals, an equivalent circuit according to the configuration of the headphone apparatus in FIG. 3 is shown in FIG. 4. As is generally known, the microphone 12 has two terminals 1 and 2. A resistance element 16 also has two terminals N1 and N2, and a resistance element 24 also has two terminals N1 and N2. The button 18 is a switch element, which is conducted when pressed, for example, such that a selected resistance element 16 is connected in parallel to the microphone 12.

Figure 5:
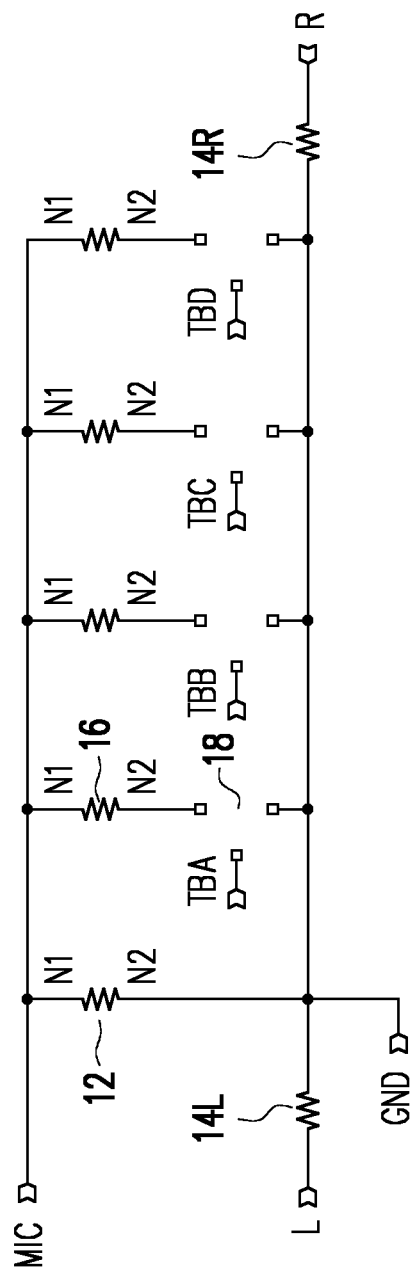
FIG. 5 is a schematic diagram of an equivalent circuit of a headphone apparatus according to an embodiment of the disclosure.
Figure 6:
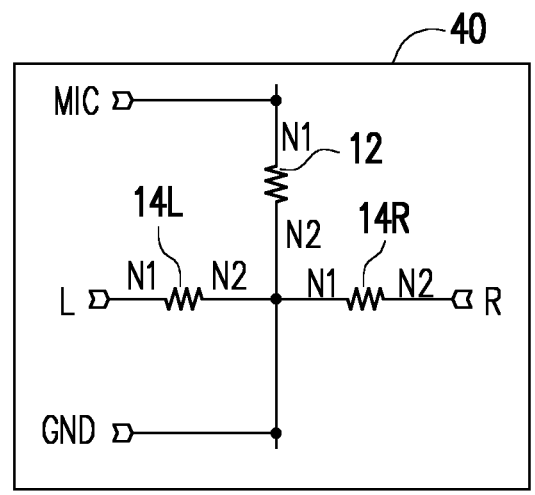
FIG. 6 is a simplified equivalent circuit diagram of a headphone apparatus of FIG. 5 according to an embodiment of the disclosure.

FIG. 5 is a schematic diagram of an equivalent circuit of a headphone apparatus according to an embodiment of the disclosure. Please refer to FIG. 5. To facilitate analysis, the speakers 14L, 14R and the microphone 12 are made equivalent as resistance elements according to the circuit of FIG. 4, as shown in FIG. 5 to facilitate analysis. FIG. 6 is a simplified equivalent circuit diagram of a headphone apparatus of FIG. 5 according to an embodiment of the disclosure. Please refer to FIG. 6. Omitting the connection with the resistance element 16, the equivalent circuit of a headphone apparatus 40 may be simplified into three resistance elements corresponding to two speakers 14L, 14R and one microphone 12. The three resistance elements are commonly connected to the ground terminal GND. It may be understood that the ground terminal GND is a low voltage terminal of the circuit, which does not need to be 0V.

Figure 7:
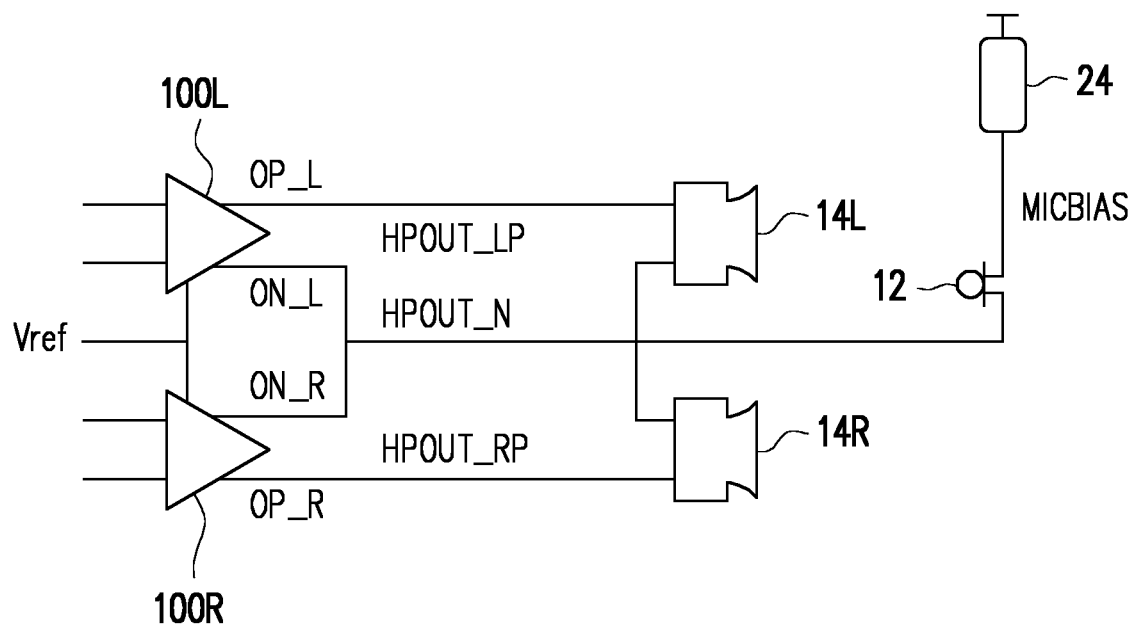
FIG. 7 is a schematic diagram of an overall structure between a headphone apparatus and a driver according to an embodiment of the disclosure.

FIG. 7 is a schematic diagram of an overall structure between a headphone apparatus and a driver according to an embodiment of the disclosure. Referring to FIG. 7, the headphone apparatus is connected to the headphone driver. The headphone driver corresponds to two channels and includes two differential drivers 100L and 100R, such as differential amplifiers. The differential driver 100L and the differential driver 100R receive the audio source and a reference voltage Vref. A positive terminal OP_L of the differential driver 100L serves as a positive output terminal HPOUT_LP, connected to one terminal of the speaker 14L. A positive terminal OP_R of the differential driver 100R serves as a positive output terminal HPOUT_RP, connected to one terminal of the speaker 14R. A negative terminal ON_L and a negative terminal ON_R are connected together to provide a common negative output terminal HPOUT_N to the other terminal of the speaker 14L and the other terminal of the speaker 14R, which are also connected to the ground terminal of the microphone 12. The voltage source 24 provides a voltage MICBIAS to drive the microphone 12.

Figure 8:
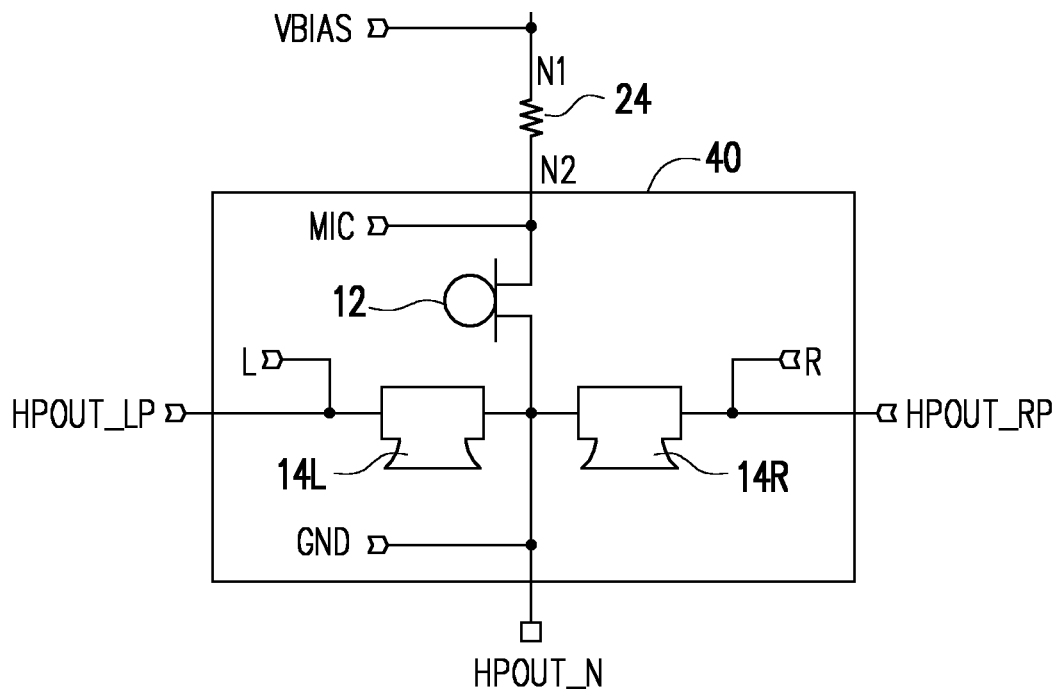
FIG. 8 is a schematic diagram of a CTIA headphone apparatus including a headphone identification circuit according to an embodiment of the disclosure.
Figure 9:
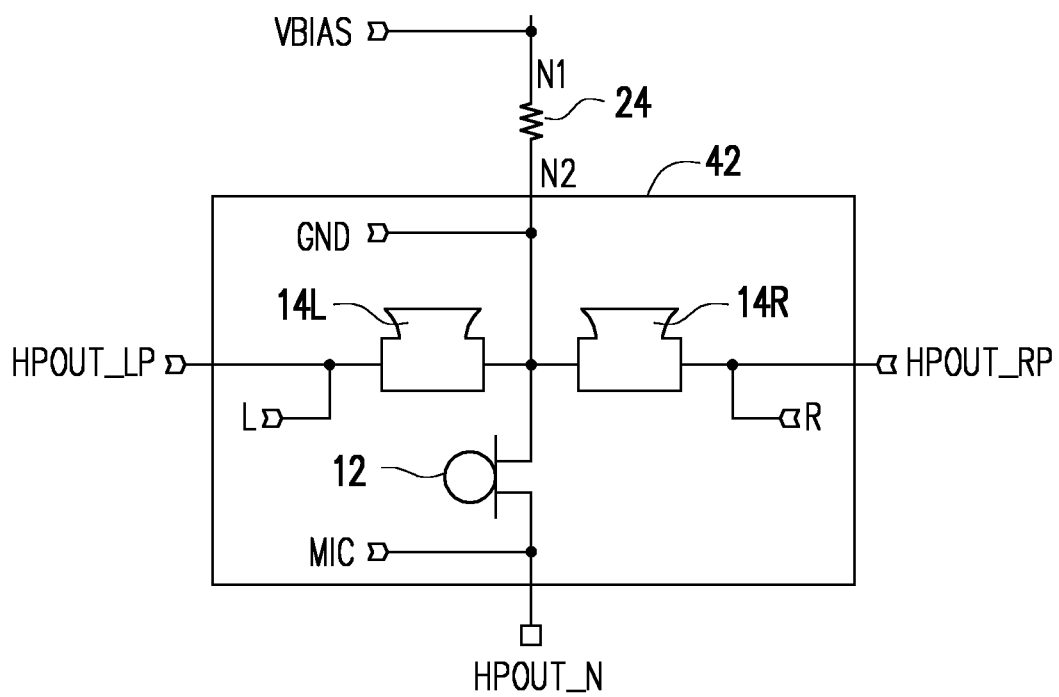
FIG. 9 is a schematic diagram of an OMTP headphone apparatus including a headphone identification circuit according to an embodiment of the disclosure.

The following describes the connecting structure of the CTIA headphone apparatus and the OMTP headphone apparatus. FIG. 8 is a schematic diagram of a CTIA headphone apparatus including a headphone identification circuit according to an embodiment of the disclosure. FIG. 9 is a schematic diagram of an OMTP headphone apparatus including a headphone identification circuit according to an embodiment of the disclosure.

Please refer to FIG. 8. Considering the connecting structure of the CTIA headphone apparatus, the ground terminal GND of the equivalent circuit of the headphone apparatus 40 is connected to the negative output terminal HPOUT_N. One terminal of the speaker 14L is connected to the positive output terminal HPOUT_LP. One terminal of the speaker 14R is connected to the positive output terminal HPOUT_LR. One terminal of the microphone 12 as the microphone terminal MIC is connected to the voltage source 24. The voltage source 24 in an example is a resistor, of which one terminal of the voltage source 24 receives the voltage VBIAS and the voltage source 24 provides the voltage as needed by the microphone 12 through the resistor.

Referring to FIG. 9, the terminal positions of a headphone jack of the electronic apparatus and the plug of the headphone apparatus are fixed. Considering the connecting state when the plug 50 of the OMTP headphone apparatus is plugged into the jack, the ground terminal GND of the equivalent circuit of a headphone apparatus 42 is connected to the voltage source 24 when the plug 50 of the headphone apparatus 42 plugs into the jack. At this state, the OMTP headphone apparatus in type is not corresponding to the CTIA jack and a switch is necessary as would be described later. One terminal of the microphone 12 is connected to the negative output terminal HPOUT_N. One terminal of the speaker 14L is connected to the positive output terminal HPOUT_LP. One terminal of the speaker 14R is connected to the positive output terminal HPOUT_LR. The ground terminal GND of the OMTP headphone apparatus and the microphone terminal MIC of the microphone 12 are opposite in relation to the CTIA headphone apparatus 40 in FIG. 8 in terms of plug position, as shown in FIG. 1.

In practical operation, after the headphone apparatus 42 is plugged into the jack, the electronic apparatus needs to detect whether the headphone apparatus 42 is the type of CTIA or OMTP. The detection mechanism may be based on the connection difference as shown in FUG. 8 and FIG. 9. In an example, the terminals of VIBAS and HPOUT_N are applied different voltages, to produce a voltage bias, crossing over the equivalent resistor of the microphone 12. In FIG. 8, the voltage of the HPOUT_LP terminal or the HPOUT_RP terminal is substantially equal to the voltage at the HPOUT_N. Then, it is judged that the headphone apparatus 42 is CTIA. As to FIG. 9, if the headphone apparatus 42 of OMTP is plugged, the microphone 12 is located at the lower side and is connected to the HPOUT_N terminal so that a voltage different would be produced between the HPOUT_N terminal and the HPOUT_LP or HPOUT_RP terminal, due to the equivalent resistor of the microphone 12. In other words, the voltage at the HPOUT_LP or HPOUT_RP terminal is substantially not equal to the voltage at the HPOUT_N terminal. Thus, this status may be judged as that the headphone apparatus 42 is OMTP type.

Figure 10:
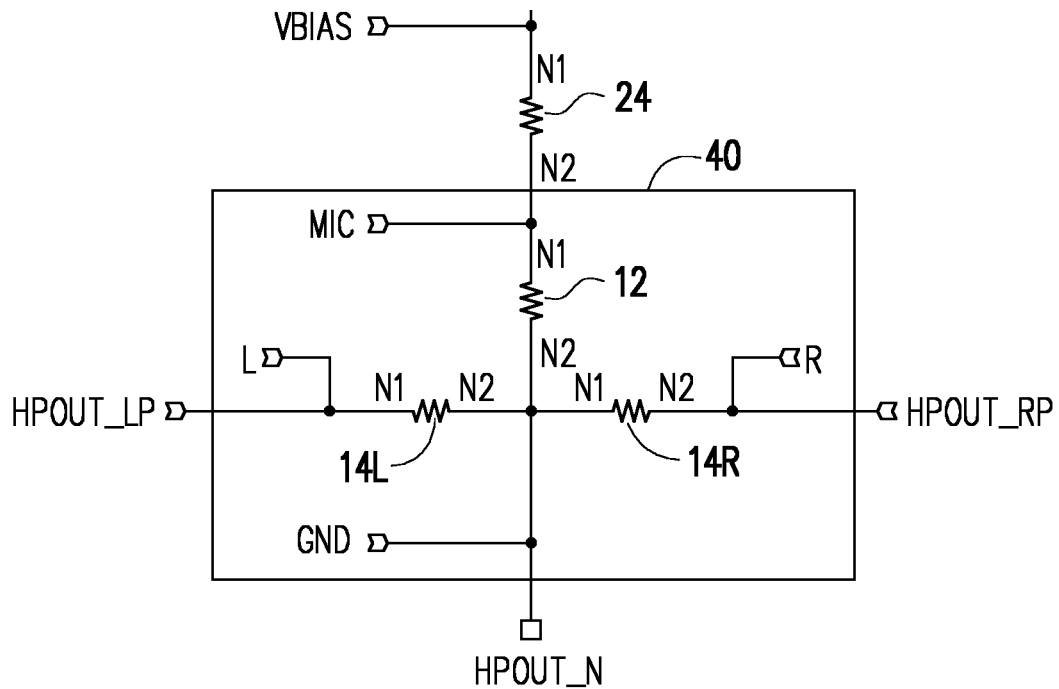
FIG. 10 is a schematic diagram of an equivalent circuit of a CTIA headphone apparatus of FIG. 8 according to an embodiment of the disclosure.
Figure 11:
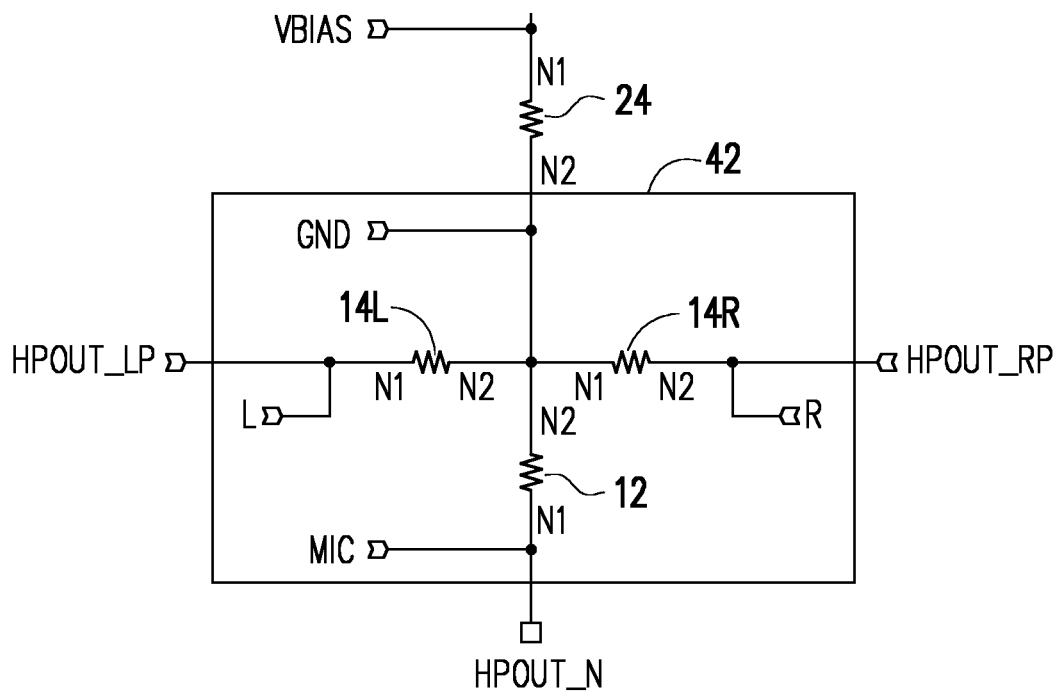
FIG. 11 is a schematic diagram of an equivalent circuit of an OMTP headphone apparatus of FIG. 9 according to an embodiment of the disclosure.

FIG. 10 is a schematic diagram of an equivalent circuit of a CTIA headphone apparatus of FIG. 8 according to an embodiment of the disclosure. FIG. 11 is a schematic diagram of an equivalent circuit of an OMTP headphone apparatus of FIG. 9 according to an embodiment of the disclosure.

Please refer to FIG. 10 and FIG. 11. Since the structure of the OMTP headphone apparatus is different from the structure of the CTIA headphone apparatus, for example, the electronic device uses the jack of CTIA standard, so the OMTP headphone apparatus cannot work when plugged into the CTIA jack, and it needs to be switched properly. The equivalent circuits in FIG. 10 and FIG. 11 correspond to the actual working circuits to be achieved for the CTIA standard and the OMTP standard.

Figure 12:
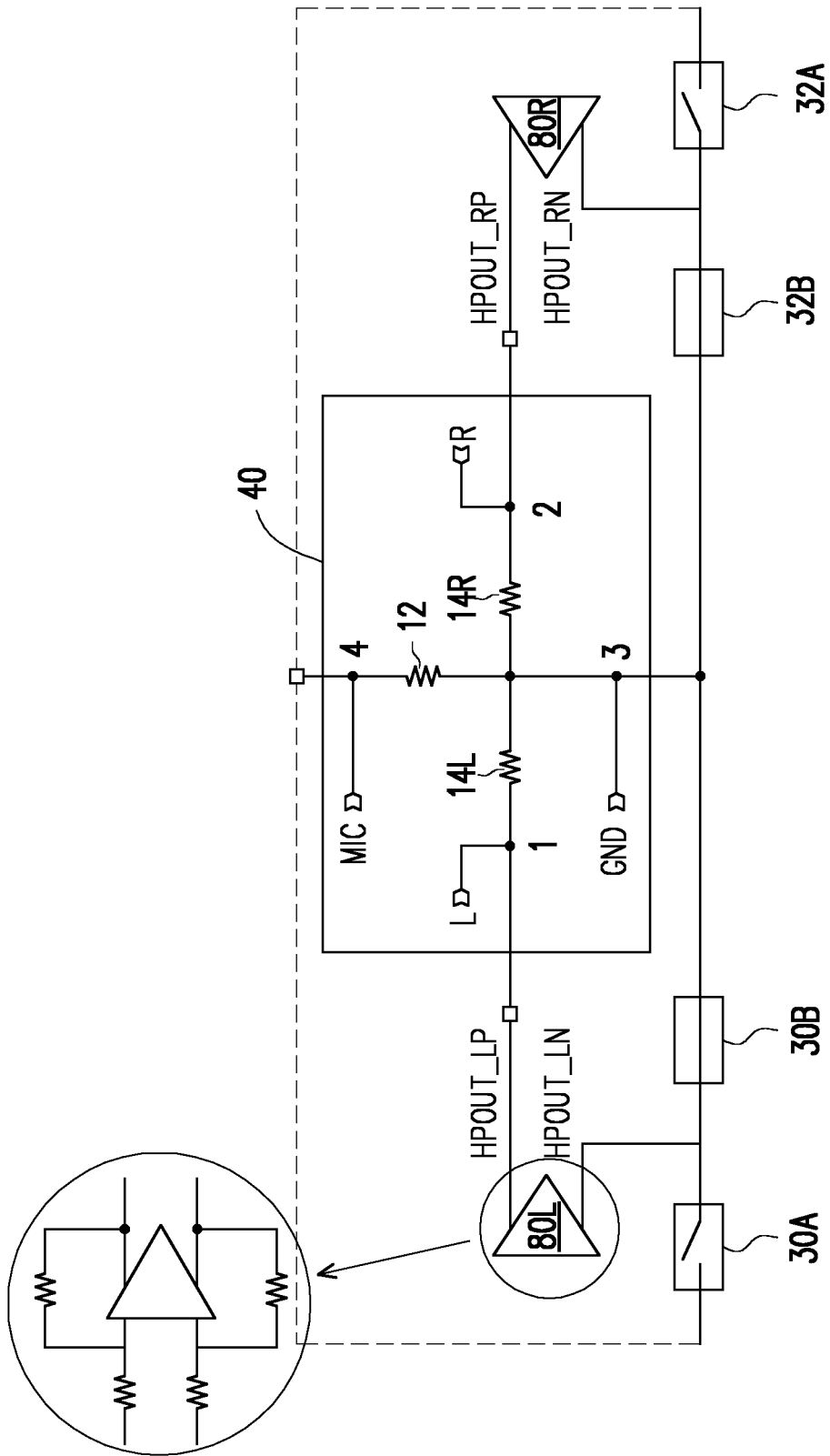
FIG. 12 is a schematic diagram of an overall circuit of a conventional headphone driver switched to a CTIA headphone apparatus according to an embodiment of the disclosure.

FIG. 12 is a schematic diagram of an overall circuit of a conventional headphone driver switched to a CTIA headphone apparatus according to an embodiment of the disclosure. Please refer to FIG. 12. The headphone driver is added with a switch unit in the negative output terminal, such as including a switch element 30A and a switch element 30B, which, for example, corresponds to the CTIA standard, where the switch element 30A is disconnected and the switch element 30B is conducted. The positive output terminal HPOUT_LP of a headphone driver 80L is the speaker 14L that drives a left channel. The positive output terminal HPOUT_LR of a headphone driver 80R is the speaker 14R that drives a right channel. The headphone driver 80L and the headphone drive 80R are, for example, differential amplifiers.

In compliance with the difference between the CTIA standard and the OMTP standard, the negative output terminals of the headphone driver 80L and the headphone driver 80R, and the microphone terminal MIC of the voltage source need to be switched properly. In one embodiment, the switch element 30A and the switch element 30B are connected to a negative output terminal HPOUT_LN and a negative output terminal HPOUT_RN of the headphone driver 80L and the headphone driver 80R. A connection path of the switch element 30A is to connect to the microphone terminal MIC. A connection path of the switch element 30B is to connect to the ground terminal GND. A connection path of the switch element 32A is to connect to the microphone terminal MIC. A connection path of the switch element 32B is to connect to the ground terminal GND.

To connect the CTIA headphone apparatus 40, the switch element 30A and the switch element 32A are disconnected, while the switch element 30B and the switch element 32B are conducted. Therefore, the negative output terminal HPOUT_LN and the negative output terminal HPOUT_RN are connected to the ground terminal GND, which is the terminal 3. The terminal 4 serves as the microphone terminal MIC to receive the voltage source.

Figure 13:
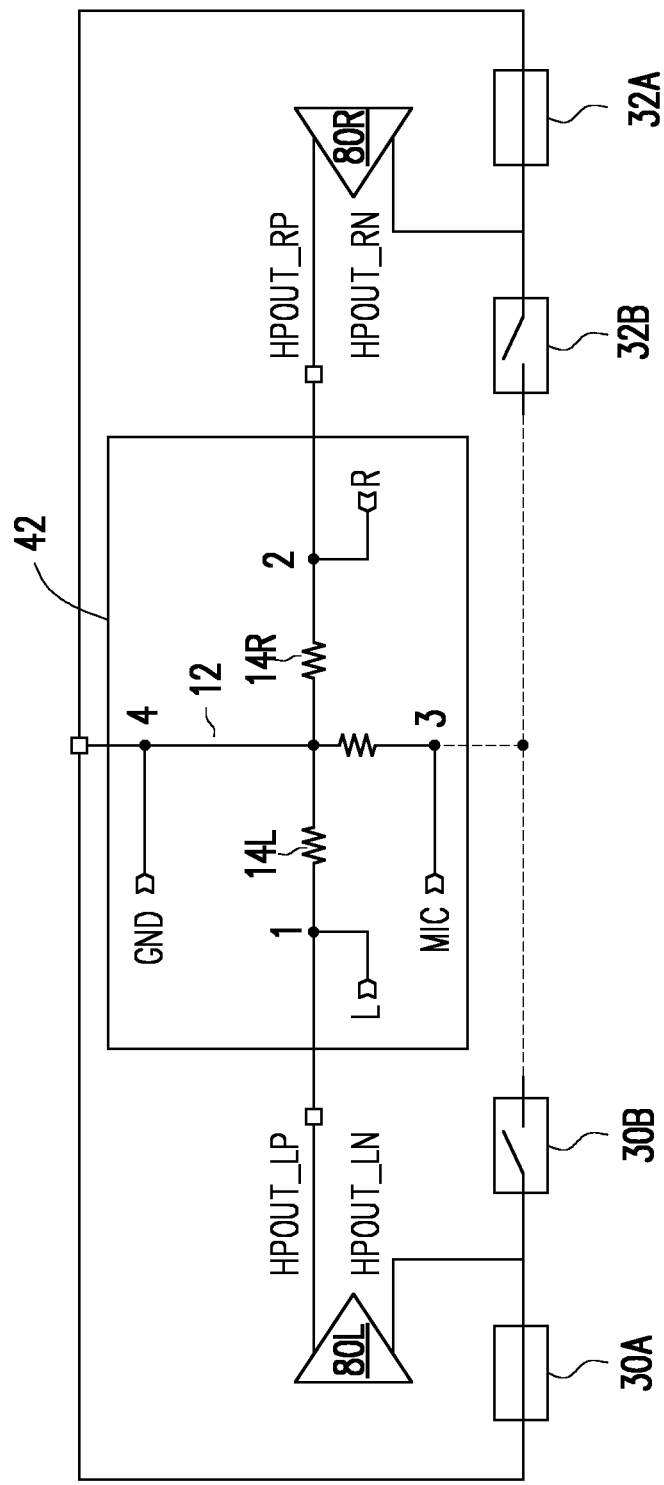
FIG. 13 is a schematic diagram of an overall circuit of a conventional headphone driver switched to an OMTP headphone apparatus according to an embodiment of the disclosure.

Please refer to FIG. 13. To connect the OMTP headphone apparatus 42, the switch element 30B and the switch element 32B are disconnected, and the switch element 30A and the switch element 32A are conducted. Therefore, the negative output terminal HPOUT_LN and the negative output terminal HPOUT_RN are connected to the terminal 4, which serves as the ground terminal GND. The terminal 3 serves as the microphone terminal MIC to receive the voltage source.

With the switching mechanisms in FIG. 12 and FIG. 13, it is possible to switch between the CTIA headphone apparatus 40 and the OMTP headphone apparatus 42, where the impedance of the headphone apparatus is, for example, 32 ohms. In order not to affect the performance of the headphone apparatus, the impedance of the switch elements with respect to the impedance of the headphone apparatus needs to be sufficiently small as being negligible. However, considering the switching mechanism in FIG. 12 and FIG. 13, the switch elements require a large area design to reduce the. Since the switch element directly switches the output signals of the headphone driver, the design of the switch element does not easily meet the requirement of low impedance, and a large area is generally used to reduce the impedance.

In one embodiment of the disclosure, a switching mechanism is proposed, which allows the switch element to be effected using generally small-sized MOS elements.

Figure 14:
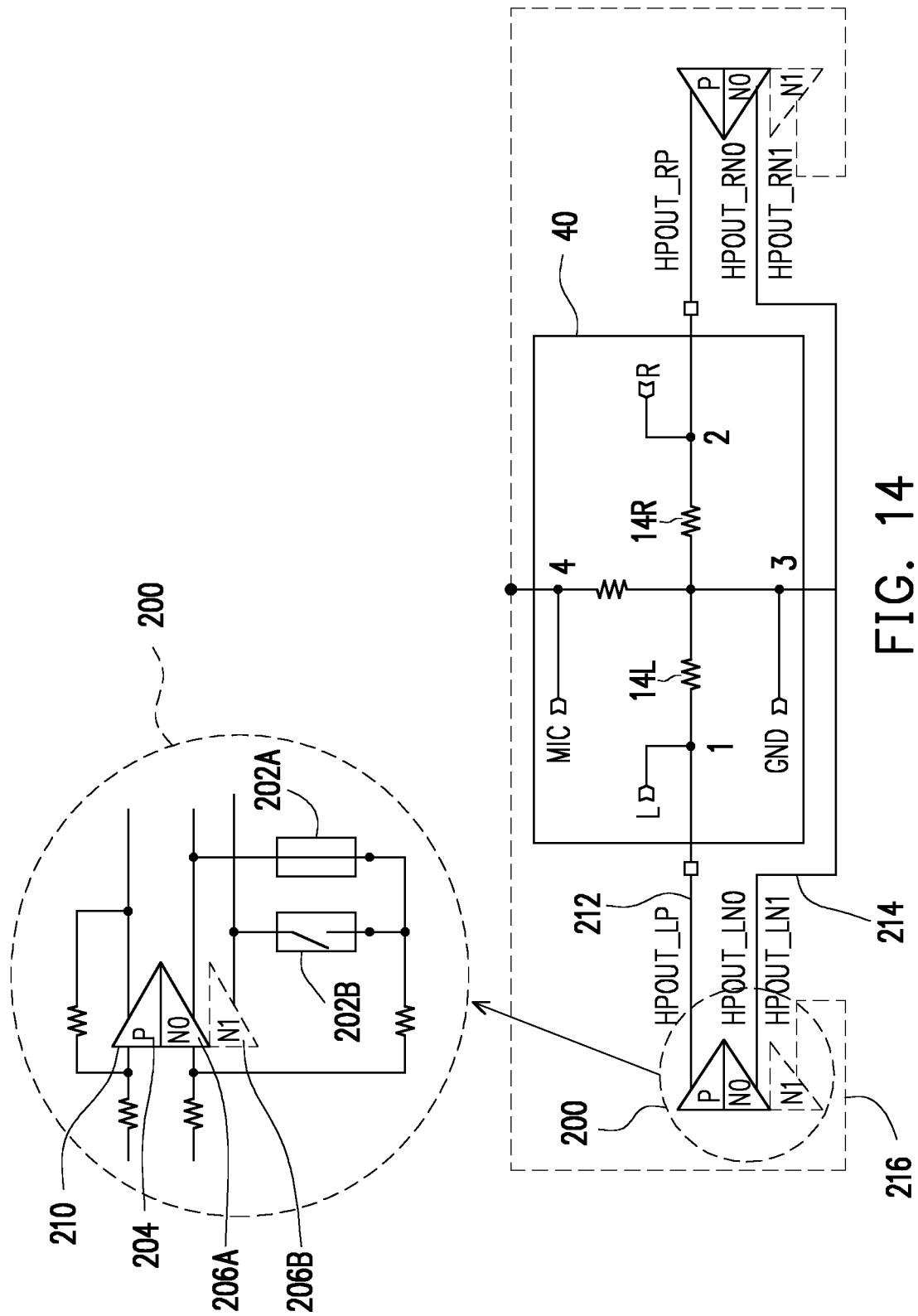
FIG. 14 is a schematic diagram of an overall circuit of a modified headphone driver switched to a CTIA headphone apparatus according to an embodiment of the disclosure.

FIG. 14 is a schematic diagram of an overall circuit of a modified headphone driver switched to a CTIA headphone apparatus according to an embodiment of the disclosure. Please refer to FIG. 14. One channel of a headphone driver 200 includes a differential driver 210, which is, for example, modified to include a positive drive circuit 204, a negative drive circuit 206A, and a negative drive circuit 206B according to a positive circuit and a negative circuit of the differential amplifier. The following takes the differential driver 210 of the left channel as an example for explanation, while the differential driver of the right channel is the same and will not be described separately.

The positive drive circuit 204 is configured to finally provide the positive output voltage HPOUT_LP, which is connected to the terminal 1 through a path 212. The negative drive circuit 206A is a circuit symmetrical to the positive drive circuit 204, and finally provides a negative output voltage HPOUT_LN0. In an embodiment, the negative drive circuit 206B and the negative drive circuit 206A for example, may have similar circuit but separately activated, in which the transistors at two terminals connected to the input voltage terminal and the output terminal in the circuit may be shared by the negative drive circuit 206B and the negative drive circuit 206A. In an example, the shared transistors may be the transistors 311 and 316 in FIG. 18 as to be described in detail. In other words, as to the circuit hardware, the negative drive circuit 206B and the negative drive circuit 206A are similar circuits and some transistors in an example may be shared. The negative drive circuit 206A and the negative drive circuit 206B are respectively activated according to the detection result of CTIA or OMTP, to correspondingly provide the negative output voltage HPOUT_LN0 (FIG. 14) or the negative output voltage HPOUT_LN1 (FIG. 15).

Moreover, the differential driver 210 also includes a switch unit, with a switch circuit 202A and a switch circuit 202B controlling the startup and shutdown of loops of the negative drive circuit 206A and the negative drive circuit 206B, respectively. The switch circuit 202A and the switch circuit 202B are in opposite states; only one of them is kept conducted while the other is disconnected. The switch circuit 202A and the switch circuit 202B are, for example, disposed on the feedback path of the differential amplifier, and may control the conduction or disconnection of the feedback path. The ground terminals GND of the CTIA headphone apparatus 40 and the OMTP headphone apparatus 42 are independently provided by the negative output voltage HPOUT_LN0 and the negative output voltage HPOUT_LN1, respectively. The negative output voltage HPOUT_LN0 is connected to the terminal 4 through a path 214, corresponding to the ground terminal GND of the CTIA headphone apparatus 40. The negative output voltage HPOUT_LN1 is connected to the terminal 3 through a path 216, corresponding to the microphone terminal MIC of the CTIA headphone apparatus 40, but the path 216 is disconnected when the path 214 is conducted.

FIG. 14 shows the connection corresponding to the CTIA headphone apparatus 40, and the negative output voltage HPOUT_LN0 is independently provided by the negative drive circuit 206A of the headphone driver 200, and the feedback loop is conducted by the control of the switch circuit 202A. The feedback loop of the negative drive circuit 206B is opened by the control of the switch circuit 202B.

Figure 15:
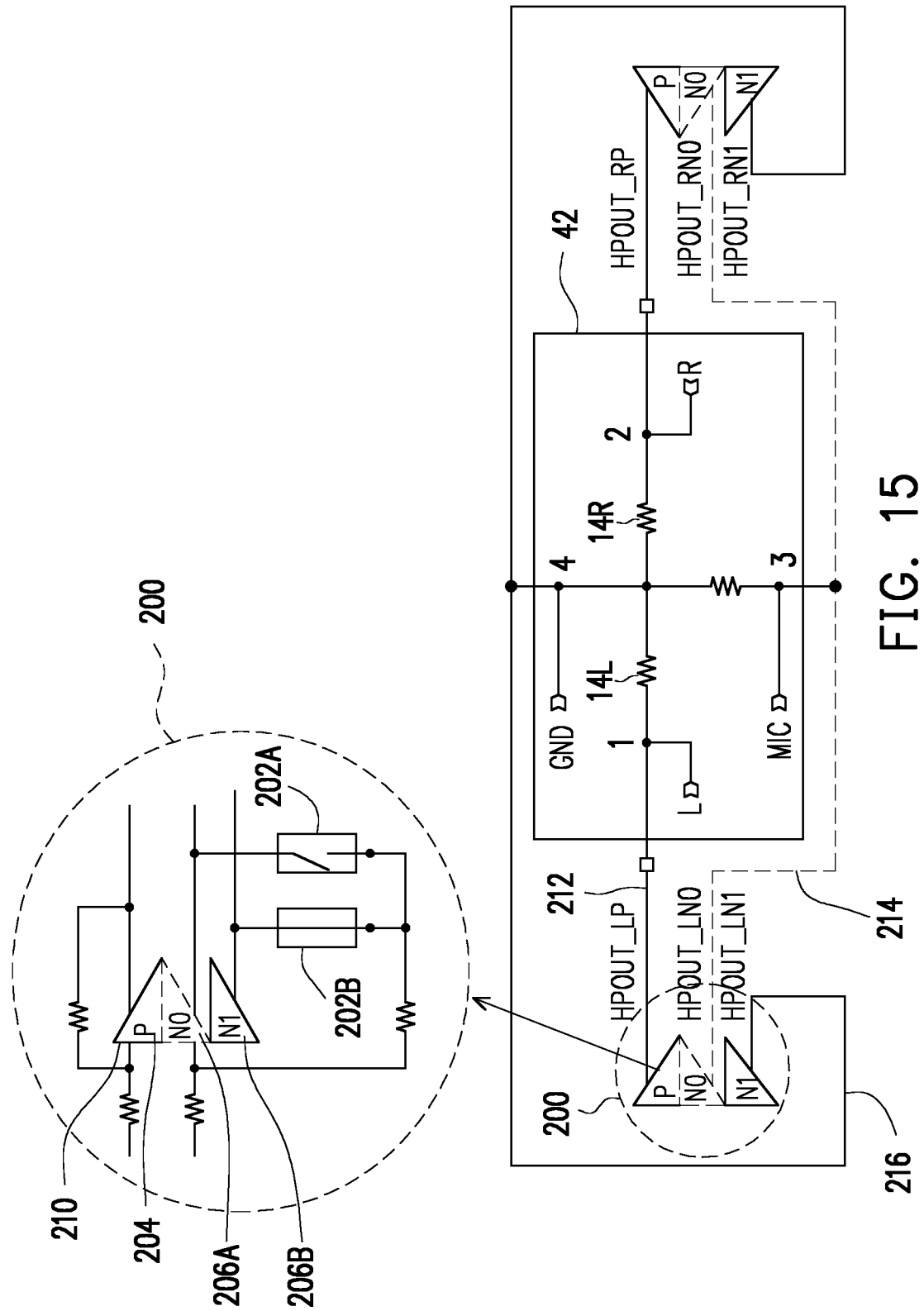
FIG. 15 is a schematic diagram of an overall circuit of a modified headphone driver switched to an OMTP headphone apparatus according to an embodiment of the disclosure.

FIG. 15 is a schematic diagram of an overall circuit of a headphone driver switched to and an OMTP headphone apparatus according to an embodiment of the disclosure. Please refer to FIG. 15. Corresponding to the connection of the OMTP headphone apparatus 42, the switch circuit 202A is switched to the disconnected state, and the switch circuit 202B is switched to the conducted state. In this way, the path 214 is disconnected by the switch circuit 202A, and the path 216 turns on the switch circuit 202B to provide the negative output voltage HPOUT_LN1 to the terminal 4, which corresponds to the ground terminal GND of the OMTP headphone apparatus 42. The terminal 3 is the microphone terminal MIC, which receives the microphone drive voltage.

Since the negative drive circuit 206A and the negative drive circuit 206B are independent outputs in the headphone driver 200, the negative output voltage HPOUT_LN0 and the negative output voltage HPOUT_LN1 are not in a shared state. For such circuits, the switch circuit 202A and the switch circuit 202B may be manufactured using general MOS elements, in which the impedance just needs to be much smaller than the impedance of the feedback resistor. As a result, the area of the component would be small enough. The manufacturing process of the switch circuit 202A and the switch circuit 202B is compatible with the manufacturing process of the MOS transistor and the drive circuit, and will not substantially increase the difficulty of manufacturing.

The circuit structure of the switch circuit 202A and the switch circuit 202B may be designed according to actual needs, and in one embodiment, no special limitation is required.

Figure 16:
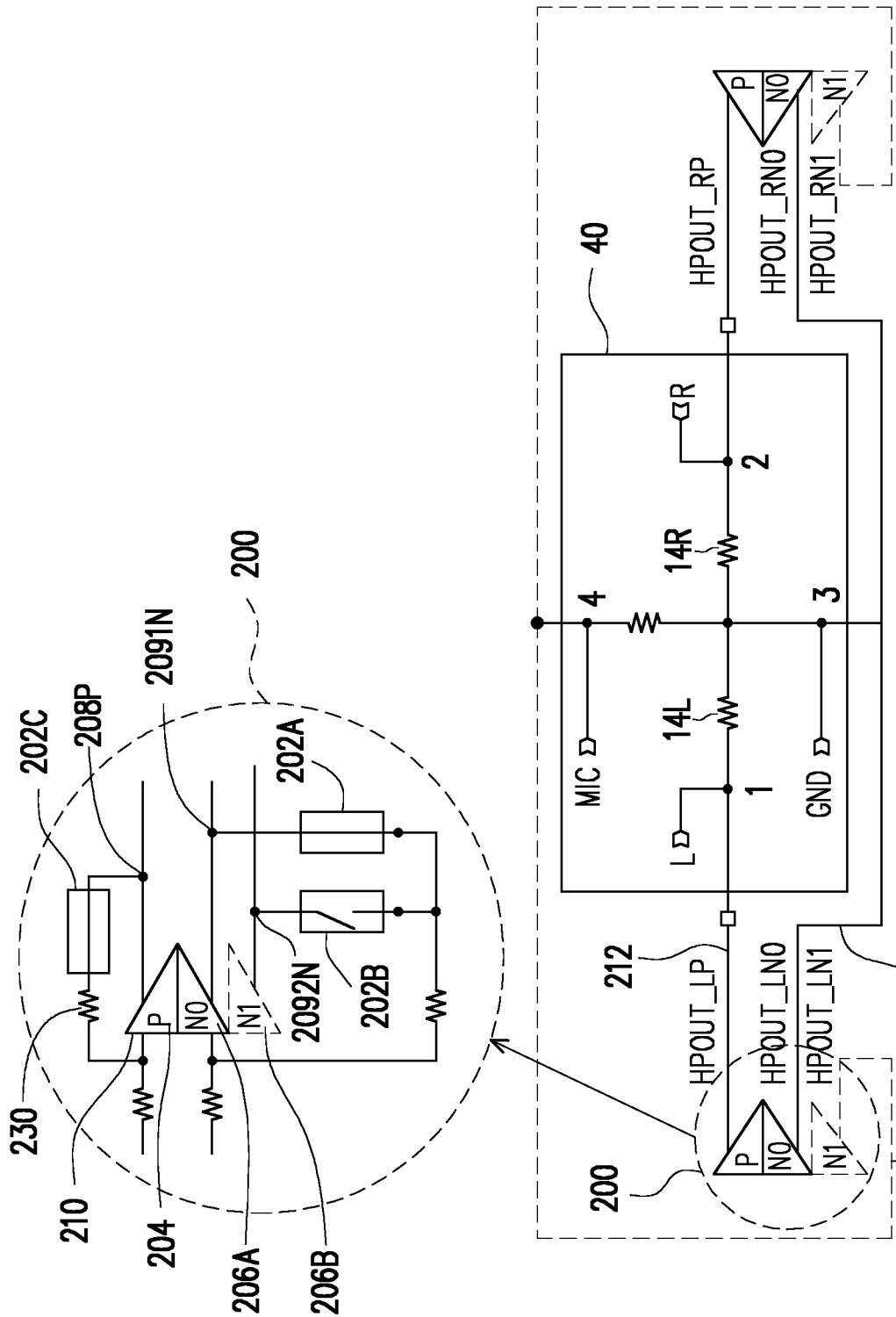
FIG. 16 is a schematic diagram of an overall circuit of a modified headphone driver switched to a CTIA headphone apparatus according to an embodiment of the disclosure.

FIG. 16 is a schematic diagram of an overall circuit of a modified headphone driver switched to a CTIA headphone apparatus according to an embodiment of the disclosure. Please referring to FIG. 16. Further considering the performance of the headphone, when the headphone apparatus is at a standby state, there may be a current at the positive output terminal flowing through the resistor 230 and feeding back into signal input terminal resulting in leakage, then a switch circuit 202C is provided so as to open the path 212 in the standby state. However, in a general situation, the positive output voltage HPOUT_LP is signal-dependent. A bulk of the CMOS element of the switch circuit 202C is also connected to the positive output voltage HPOUT_LP in the operation state, so as to avoid the non-linearity caused by a body effect in the operation state. In addition, in the standby state, another stable voltage is applied back to the bulk to avoid leakage. In another embodiment, the NMOS in the switch circuit of the CMOS element may also be formed in a deep N-well, for example.

Figure 17:
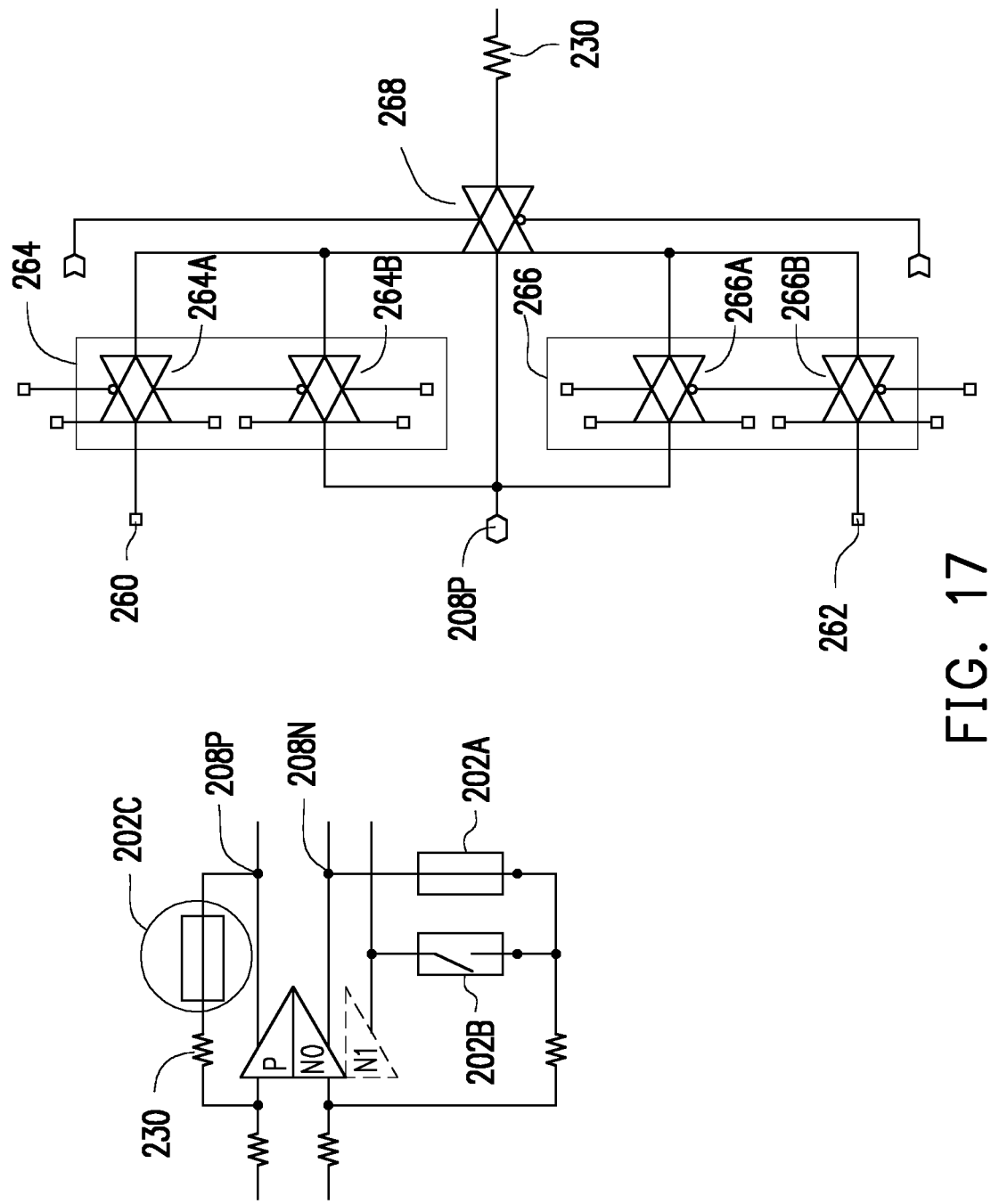
FIG. 17 is a schematic diagram of a circuit of a positive output terminal of a headphone driver according to an embodiment of the disclosure.

FIG. 17 is a schematic diagram of a circuit of a positive output terminal of a headphone driver according to an embodiment of the disclosure. Referring to FIG. 17, a headphone driver 200 has a positive output terminal 208P and a negative output terminal 208N. The negative output terminal 208N is connected to the ground terminal GND of the corresponding headphone apparatus as described above. The corresponding operation state or the standby state of the positive output terminal 208P are controlled by the switch circuit 202C. The switch circuit 202C is, for example, set on the feedback path.

In one embodiment, the structure of the switch circuit 202C is, for example, made up of three switch elements 264, 266, and 268, which are connected between the positive output terminal 208P and the resistor 230. The switch element 264 is made up of, for example, two CMOS switch elements 264A and 264B. Just one of the switch elements 264A and 264B is ON according to a switch state. The switch element 266 is made up of, for example, two CMOS switch elements 266A and 266B. Just one of the switch elements 266A and 266B is ON according to a switch state. As usual, the CMOS switch element is made up of a NMOS transistor and a PMOS transistor, and the NMOS transistor is formed in the deep N-well. The switch element 268 is a single CMOS switch element.

The positive output terminal 208P is connected to the CMOS switch element 264B, the CMOS switch element 266A, and the CMOS switch element 268. A terminal 260 of the CMOS switch element 264 receives a system low voltage. Further, a terminal 262 of the CMOS switch element 266B receives another voltage. The NMOS transistor of the switch element 268 has the bulk, which may be connected to the positive output terminal 208P through the switch element 264B or connected to the terminal 260 for receiving a system low voltage such as a certain one of the lowest voltage GND through the switch element 264A. The PMOS transistor the switch element 268 has the bulk, which may be connected to the positive output voltage 208B through the switch element 266A or connected to the terminal 262 for receiving another voltage, such as a certain one of the highest system voltage VDD. The NMOS transistor of the switch element 268 has the bulk, which may be connected to the positive output terminal 208P through the switch element 264B and the PMOS transistor of the switch element 268 has the bulk, which may be connected to positive output terminal 208P through the switch element 266A. Thus, during the signal being conducted, the acoustic distortion may be effectively removed, in which the acoustic distortion may be induced due to the body effect, causing the equivalent impedance of the switch element 268 to change with the variance of the signal strength.

Here, the actual circuit of the switch circuit 202C is only an embodiment; it may be configured according to actual needs to achieve the required functions, and will not be described in further detail.

Figure 18:
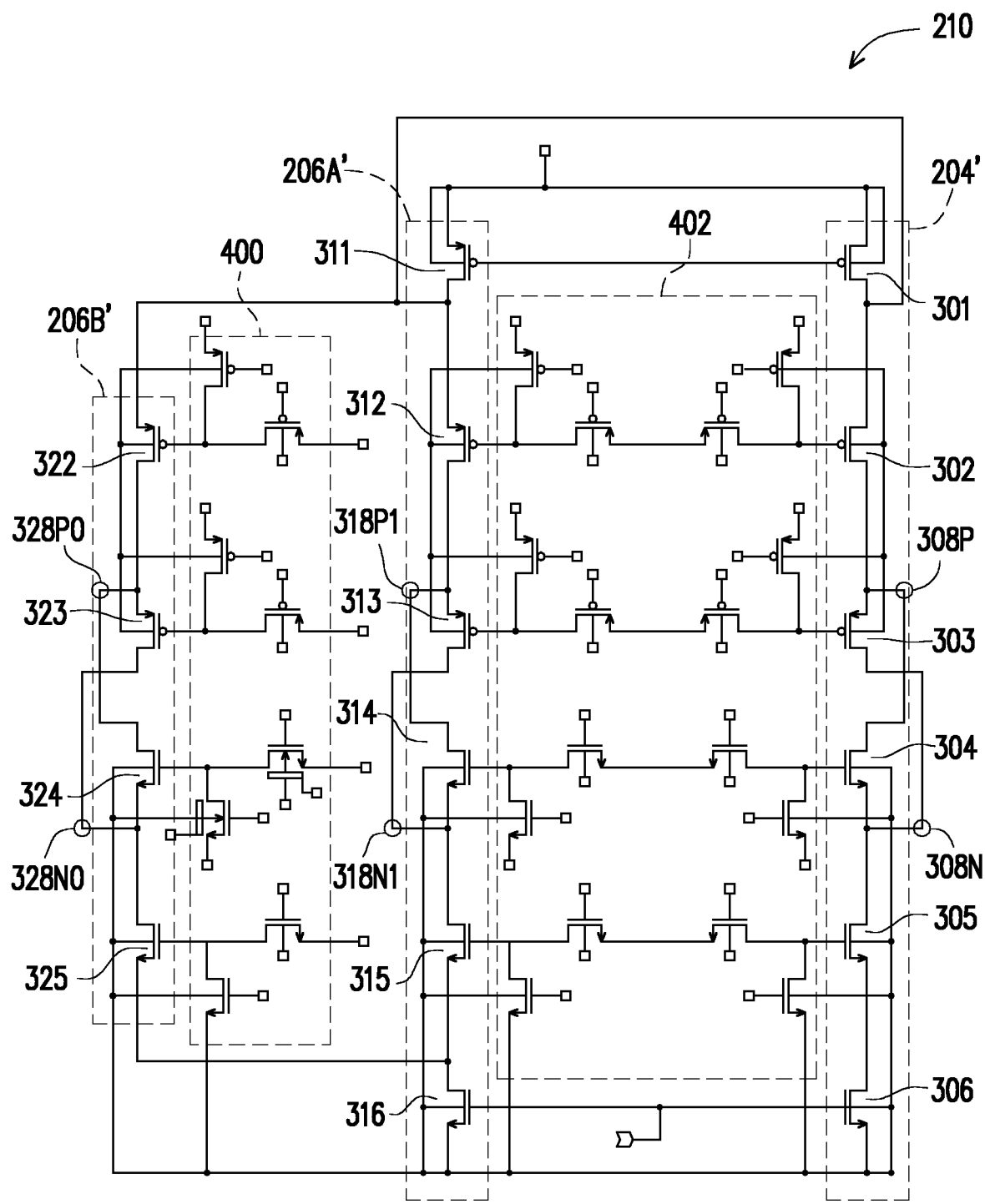
FIG. 18 is a schematic diagram of a core circuit of a headphone driver according to an embodiment of the disclosure.

FIG. 18 is a schematic diagram of a core circuit of a headphone driver according to an embodiment of the disclosure. Please refer to FIG. 18. In one embodiment, the core circuit corresponding to one channel includes the differential driver 210, such as a differential amplifier. The core circuit is made up of, for example, multiple p-type transistors and multiple N-type transistors, which is of CMOS circuit structure in terms of semiconductor manufacturing. The core circuit of the differential driver 210 includes a positive drive circuit 204' and two negative drive circuits 206A' and 206B'. The positive drive circuit 204' includes, for example, three PMOS transistors 301, 302, and 303 and three NMOS transistors 304, 305, and 306 connected in series. The negative drive circuit 206A also includes three PMOS transistors 311, 312, and 313 and three NMOS transistors 314, 315, and 316 connected in series. The positive drive circuit 204' and the negative drive circuit 206A' are of the structure of the differential amplifier, and the two terminals are connected between a system high voltage and the system low voltage.

The negative drive circuit 206B' and the switch circuit 202A, the switch circuit 202B, and the switch circuit 202C configured according to FIG. 14 to FIG. 17 are also made up of the multiple PMOS transistors and the multiple NMOS transistors.

The configuration of the negative drive circuit 206B' is duplicating a part of circuit of the negative drive circuit 206A' to form another circuit similar to the negative drive circuit 206A', corresponding to the operation of the negative drive circuit 206B in FIG. 15, such as duplicating the transistors 312, 313, 314, and 315 into transistors 322, 323, 324, and 325. The negative drive circuit 206B' adding with the shared transistor 311 and the shared transistor 316 of the negative drive circuit 206A' may for the similar circuit to the negative drive circuit 206A', which is corresponding to the use of the negative drive circuit 206B in FIG. 15. In addition, the negative drive circuit 206A' is corresponding to the use of the negative drive circuit 206A in FIG. 14. In this way, the output of the positive drive circuit 204' is included in a pair of nodes 308P and 308N so as to subsequent generate of a positive output voltage. The output of the negative drive circuit 206A' includes a pair of nodes 318P1 and 318N1, so as to subsequently generate a negative output voltage. The output of another negative drive circuit 206B' is included in a pair of nodes 328P0, 328N0, so as to subsequently generate another negative output voltage. The switch circuit 400 and the switch circuit 402 form a switch unit, so as to have the control capability of the switch circuits 202A, 202B, and 202C described above.

Here, the overall structure of the differential driver 210 includes peripheral control circuits surrounding the core circuit. The detailed circuit design is not described in more detail here, but can be achieved by following the design of the function to be achieved.

To sum up the previous description, in the design of the driver of the disclosure, the negative output terminal is configured to be two independent negative output voltages, and are provided independently to the ground terminal GND in accordance with the CTIA standard and the OMTP standard, in which the switching in between is performed by the switch unit. In addition, as also described in FIG. 16 and FIG. 17 as an example, considering the possibility of leakage of the headphone apparatus in the standby state, a switch circuit 202C may also be added to the feedback path of the positive output voltage. However, a bulk of the CMOS element of the switch circuit 202C may be also connected to the positive output voltage HPOUT_LP in the operation state, so as to avoid the non-linearity caused by a body effect in the operation state and then resulting in acoustic distortion. In addition, in the standby state, another stable voltage is applied back to the bulk to avoid leakage.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A headphone driver, driving a headphone apparatus, wherein the headphone apparatus has a first terminal, a second terminal, a third terminal, and a fourth terminal of fixed positions, the headphone driver comprising:
a first differential driver, comprising a first positive drive circuit, a first negative drive circuit, and a second negative drive circuit, respectively providing a first positive output terminal, a first negative output terminal, and a second negative output terminal, the first positive output terminal connected to the first terminal, the first negative output terminal and the second negative output terminal respectively connected to the third terminal and the fourth terminal;
a second differential driver, comprising a second positive drive circuit, a third negative drive circuit, and a fourth negative drive circuit, respectively providing a second positive output terminal, a third negative output terminal, and a fourth negative output terminal, the second positive output terminal connected to the second terminal, the first negative output terminal and the second negative output terminal respectively connected to the third terminal and the fourth terminal;
a first switch unit, controlling the first differential driver to respectively select according to a first operation state or a second operation state the first negative drive circuit or the second negative drive circuit to output; and
a second switch unit, controlling the second differential driver to respectively select according to the first operation state or the second operation state the third negative drive circuit or the fourth negative drive circuit to output.

2. The headphone driver as described in claim 1, wherein the first terminal and the second terminal of the headphone apparatus are respectively connected to two speakers, and a microphone is disposed between the third terminal and the fourth terminal, wherein the third terminal is a negative terminal of the microphone in the first operation state, and the fourth terminal is a negative terminal of the microphone in the second operation state.

3. The headphone driver as described in claim 2, wherein each of the first differential driver and the second differential driver further comprises a voltage switch circuit disposed on a feedback path of the first positive output terminal and the second positive output terminal, to be disconnected in a standby state and be applied with a stable voltage.

4. The headphone driver as described in claim 3, wherein when the voltage switch circuit in an operation state, a bulk of the PMOS transistor is correspondingly connected to the first and second positive output terminals, to remove an acoustic distortion, wherein the acoustic distortion is induced due to an equivalent impedance of a switch element of voltage switch circuit as connected to the first and second positive output terminals, being changing with a variance of the signal strength in the first and second differential drivers.

5. The headphone driver as described in claim 1, wherein the first switch unit and the second switch unit respectively comprise a plurality of N-type transistors and a plurality of P-type transistors, wherein the plurality of N-type transistors comprise a substrate of a deep N-well.

6. A headphone driver, driving a headphone apparatus, wherein the headphone apparatus has a first terminal, a second terminal, a third terminal, and a fourth terminal of fixed positions, the headphone driver comprising:
a first differential driver, comprising a first positive output terminal, a first negative output terminal, and a second negative output terminal, the first positive output terminal connected to the first terminal; and a first switch unit, disposed on a feedback path of the first negative output terminal and the second negative output terminal, configured to enable the first negative output terminal in feedback as a close loop to output to the third terminal in a first operation state and disable the second negative output terminal in feedback and disable output of the second negative output terminal as an open loop, and to be switched, in a second operation state, to enable the second negative output terminal in feedback as a close loop to output to the fourth terminal and disable the first negative output terminal in feedback and disable output of the first negative output terminal as an open loop, wherein the first differential driver comprises a first positive voltage driving circuit, a first negative voltage driving circuit, and a second negative voltage driving circuit, respectively providing the first positive output terminal, the first negative output terminal, and the second negative output terminal.

7. The headphone driver as described in claim 6, wherein the first switch unit activates one of the first negative voltage driving circuit and the second negative voltage driving circuit according to the first operation state or the second operation state.

8. The headphone driver as described in claim 7, further comprising:

a second differential driver, comprising a second positive output terminal, a third negative output terminal, and a fourth negative output terminal, the second positive output terminal connected to the second terminal; and a second switch unit, disposed on a feedback path of the first negative output terminal and the second negative output terminal, configured to enable the third negative output terminal in feedback as a close loop to output to the third terminal in a first operation state and disable the fourth negative output terminal in feedback and disable output of the fourth negative output terminal as an open loop, and to be switched, in a second operation state, to enable the fourth negative output terminal in feedback as a close loop to output to the fourth terminal and disable the third negative output terminal in feedback and disable output of the third negative output terminal as an open loop, wherein the second differential driver comprises a third negative voltage driving circuit and a fourth negative voltage driving circuit, respectively providing the third negative output terminal and the fourth negative output terminal.

9. The headphone driver as described in claim 8, wherein the second switch unit activates one of the third negative voltage driving circuit and the fourth negative voltage driving circuit according to the first operation state or the second operation state.

10. The headphone driver as described in claim 9, wherein each of the first differential driver and the second differential driver further comprises a voltage switch circuit disposed on the feedback path of the first positive output terminal and the second positive output terminal, to be disconnected in a standby state.

11. The headphone driver as described in claim 10, wherein the first positive output terminal and the second positive output terminal respectively drive a first speaker and a second speaker of the headphone apparatus, wherein a microphone is disposed between the third terminal and the fourth terminal, wherein the first negative output terminal, the second negative output terminal, the third negative output terminal, and the fourth negative output terminals provide a negative voltage to the microphone through the first switch unit and the second switch unit.

12. The headphone driver as described in claim 10, wherein the first switch unit and the second switch unit respectively comprise a plurality of N-type transistors and a plurality of P-type transistors, wherein the plurality of N-type transistors comprise a substrate of a deep N-well.

13. A headphone driving method, driving a headphone apparatus, wherein the headphone apparatus comprises a first terminal, a second terminal, a third terminal, and a fourth terminal of fixed positions, the headphone driving method comprising:

configuring a first differential driver to drive a first channel of the headphone apparatus and a microphone, the first differential driver comprising a first positive output terminal, a first negative output terminal, and a second negative output terminal, the first positive output terminal connected to the first terminal; and configuring a first switch unit, disposed on a feedback path of the first negative output terminal and the second negative output terminal, configured to be switched to connect the first negative output terminal to the third terminal in a first operation state and disconnect the second negative output terminal, and to be switched, in a second operation state, to connect the second negative output terminal to the fourth terminal and disconnect the first negative output terminal, wherein the first differential driver comprises a first negative voltage driving circuit and a second negative voltage driving circuit, respectively providing the first negative output terminal and the second negative output terminal.

14. The headphone driving method as described in claim 13, wherein the first switch unit activates one of the first negative voltage driving circuit and the second negative voltage driving circuit according to the first operation state or the second operation state.

15. The headphone driving method as described in claim 14, further comprising:

configuring a second differential drive to drive a second channel and the microphone of the headphone apparatus, the second differential driver comprising a second positive output terminal, a third negative output terminal, and a fourth negative output terminal, the second positive output terminal connected to the second terminal; and configuring a second switch unit, disposed on the feedback path of the first negative output terminal and the second negative output terminal, configured to be switched to connect the third negative output terminal to the third terminal in the first operation state and disconnect the fourth negative output terminal, and to be switched, in the second operation state, to connect the fourth negative output terminal to the fourth terminal and disconnect the third negative output terminal, wherein the second differential driver comprises a third negative voltage driving circuit and a fourth negative voltage driving circuit, respectively providing the third negative output terminal and the fourth negative output terminal.

16. The headphone driving method as described in claim 15, wherein the second switch unit activates one of the third negative voltage driving circuit and the fourth negative voltage driving circuit according to the first operation state or the second operation state.

17. The headphone driving method as described in claim 16, wherein each of the first differential driver and the second differential driver further comprises a voltage switch circuit disposed on the feedback path of the first positive output terminal and the second positive output terminal, to be disconnected in a standby state.

18. The headphone driving method as described in claim 17, wherein the first positive output terminal and the second positive output terminal respectively drive a first speaker and a second speaker of the headphone apparatus, wherein a microphone is disposed between the third terminal and the fourth terminal, wherein the first negative output terminal, the second negative output terminal, the third negative output terminal, and the fourth negative output terminal provide a negative voltage to the microphone through the first switch unit and the second switch unit.

19. The headphone driving method as described in claim 17, wherein the first switch unit and the second switch unit used respectively comprise a plurality of N-type transistors and a plurality of P-type transistors, wherein the plurality of N-type transistors comprises a substrate of a N-well.

20. The headphone driving method as described in claim 13, wherein a judgement for the first operation state and the second operation state comprises:

applying a voltage bias between the third terminal and the fourth terminal; and detecting a first voltage at one of the first terminal and the second terminal and a second voltage at the third terminal, wherein the first voltage is substantially equal to the second voltage, indicating the first operation state, wherein the first voltage is substantially different to the second voltage, indicating the second operation state.

* * * * *